United States Patent [19]
Kanayama et al.

[11] Patent Number: 5,519,320
[45] Date of Patent: May 21, 1996

[54] NUCLEAR MAGNETIC RESONANCE IMAGING WITH HIGH SPEED AND INTERACTIVE PULSE SEQUENCE CONTROL

[75] Inventors: Shoichi Kanayama, Saitama; Yoshimori Kassai, Tokyo, both of Japan

[73] Assignee: Kabushiki Kaisha Toshiba, Kawasaki, Japan

[21] Appl. No.: 40,857

[22] Filed: Mar. 31, 1993

[30] Foreign Application Priority Data

Mar. 31, 1992 [JP] Japan ............................. 4-077925

[51] Int. Cl.$^6$ ............................. G01V 3/00
[52] U.S. Cl. ................................. 324/309; 324/312
[58] Field of Search ........................ 324/300, 312, 324/314, 307, 309, 318, 322; 364/413.13, 513, 148

[56] References Cited

U.S. PATENT DOCUMENTS

| | | | |
|---|---|---|---|
| 4,835,690 | 5/1989 | Gangarosa et al. | 364/413.13 |
| 5,068,786 | 11/1991 | Netter et al. | 324/312 |
| 5,144,242 | 9/1992 | Zeilenga et al. | |
| 5,309,102 | 5/1994 | Deckard | 324/314 |

FOREIGN PATENT DOCUMENTS

| | | |
|---|---|---|
| 0195670 | 9/1986 | European Pat. Off. . |
| 3-37044 | 2/1991 | Japan . |
| WO91/00530 | 1/1991 | WIPO . |

OTHER PUBLICATIONS

The Journal of Nuclear Medicine, vol. 27, No. 2, pp. 281–286, Feb. 1986, C. N. de Graaf, et al., "Simulation Procedure to Determine Nuclear Magnetic Resonance Imaging Pulse Sequence Parameters for Optimal Tissue Contrast".

Magnetic Resonance Imaging, vol. 9, pp. 627–634, 1991, Brent K. Stewart, et al., "Software and Hardware Integration of a Microprogrammable State Machine for NMR Imaging".

Patent Abstracts of Japan, vol. 015, No. 167 (C–0827), Apr. 26, 1991, JP–A–30 37 044, Feb. 18, 1991.

Magnetic Resonance in Medicine, vol. 8, No. 1, pp.16–24, Sep. 1988, W. Dreher, et al., "Pulse Sequence and Parameter Choice in NMR Imaging as a Problem of Constrained Multi–Dimensional Nonlinear Optimization".

Primary Examiner—Louis M. Arana
Attorney, Agent, or Firm—Oblon, Spivak, McClelland, Maier & Neustadt

[57] ABSTRACT

A nuclear magnetic resonance imaging capable of controlling a generation of a desired pulse sequence to be used interactively, realizing the adjustment of the pulse sequence easily and accurately, and realizing the high speed pulse sequence execution. The pulse sequence is automatically generated from a basic pulse sequence form and a parameter block storing the imaging parameters affected by the imaging conditions specified interactively. The pulse sequence is then automatically adjusted to an optimum setting by simulating an execution of the pulse sequence by using simulated RF pulses, gradient magnetic fields, static magnetic field, and nuclear spin density distribution, according to the characteristic parameters measured in advance. In the actual execution of the pulse sequence, the event codes stored in the event memory of the sequence controller are decoded by a plurality of decoders in parallel, and the rewriting of the event memory is realized by using a rewriting table having entries specifying a manner of rewriting each slot of each entry in the event memory, and flags in the event memory indicating an appropriate rewriting table entry for each slot.

14 Claims, 16 Drawing Sheets

FIG.3A

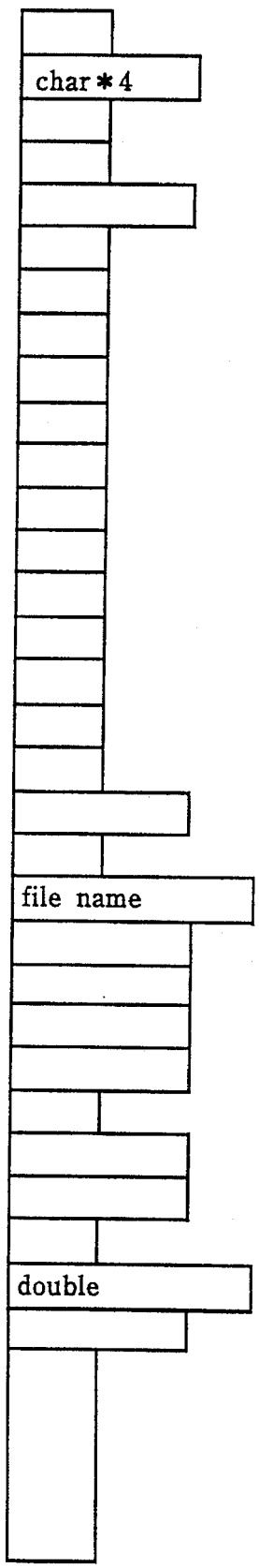

SEQUENCE ID
SEQUENCE TYPE (SE, FID, UF, etc.)
MATRIX (HALF, FULL, ASYMMETRIC)
MATRIX TYPE 2D, 3D, 4D
TOTAL NUMBER OF TR
NUMBER OF ENCODING STEPS (X)
NUMBER OF ENCODING STEPS (Y)
NUMBER OF ENCODING STEPS (Z)
NUMBER OF ENCODING STEPS (SUB 1)
NUMBER OF ENCODING STEPS (SUB 2)
TR MINIMUM VALUE
TR INPUT VALUE
TE MINIMUM VALUE
TE INPUT VALUE → LOOK UP DELAY TABLE
A/D POINT NUMBER (READING DIRECTION)
A/D START NUMBER
MULTI-TIMING NUMBER
MULTI-TIMING TIME INTERVAL
TOTAL DATA SIZE
NUMBER OF AVERAGING
CPMG MODE
X DIRECTION (MATRIX SIZE)
Y DIRECTION (MATRIX SIZE)
Z DIRECTION (MATRIX SIZE)
f DIRECTION (MATRIX SIZE)
NUMBER OF SLICES (2D MODE)
SLICE THICKNESS (GS STRENGTH CONTROL)
SLICE INTERVAL (RF FREQUENCY CHANGE)
GATING TYPE (POWER SOURCE, ECG, RESPIRATION)
RESONANT FREQUENCY
RF POWER (LIMITED BY WEIGHT)
RF WAVEFORM NUMBER (NUMBER OF STORED ID
RF ID NO. (SEP/HARD) ⎫ 256 PIECES
⋮                    ⎬
⋮                    ⎭

GX ⎫
GY ⎬ GRADIENT FIELD AMP. POWER
GZ ⎪         (ADJUSTED VALUE)
GR ⎪
GE ⎪
GS ⎭

$\theta$ ⎫ OBLIQUE ANGLE SET UP PARAMETERS
$\phi$ ⎭ gsx ⎫
gsy ⎪
gsz ⎬ GRADIENT MAGNETIC FIELD STRENGTH
grx ⎪ SET UP REGISTERS
gry ⎪
grz ⎪
gex ⎪
gey ⎪
gez ⎭

GRD WAVEFORM NUMBER (NUMBER OF STORED ID)
GRD ID NO. (GRADIENT MAGNETIC ⎫ 256 PIECES
         FIELD WAVEFORM)       ⎭

⋮
⋮

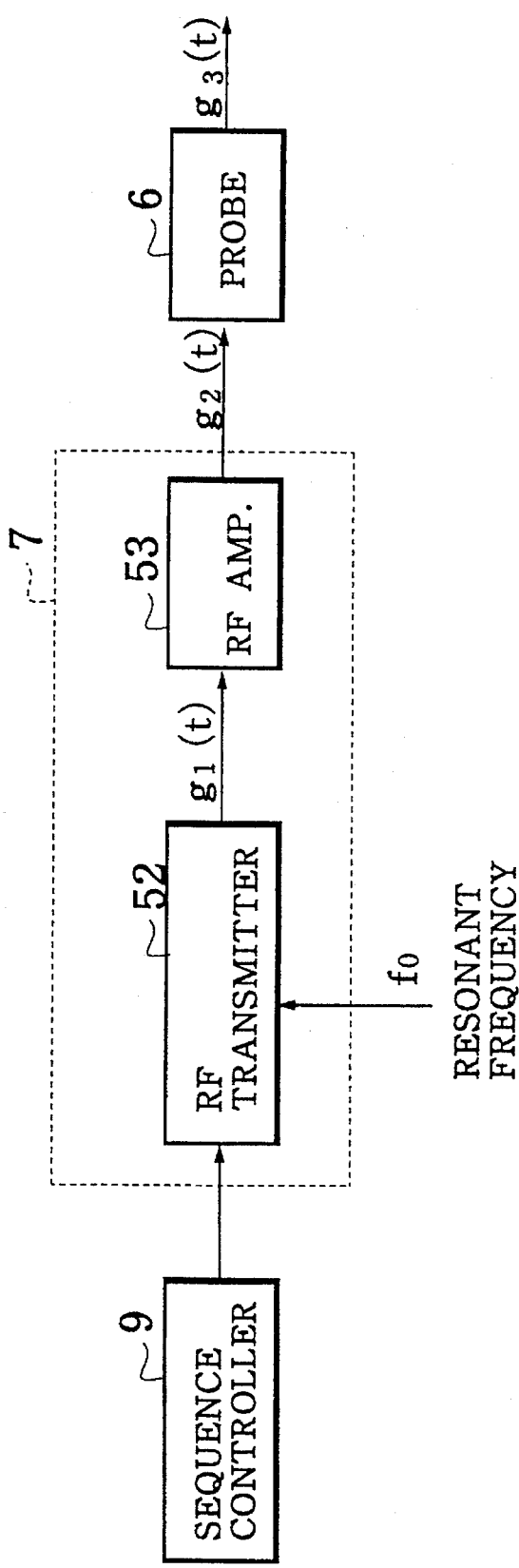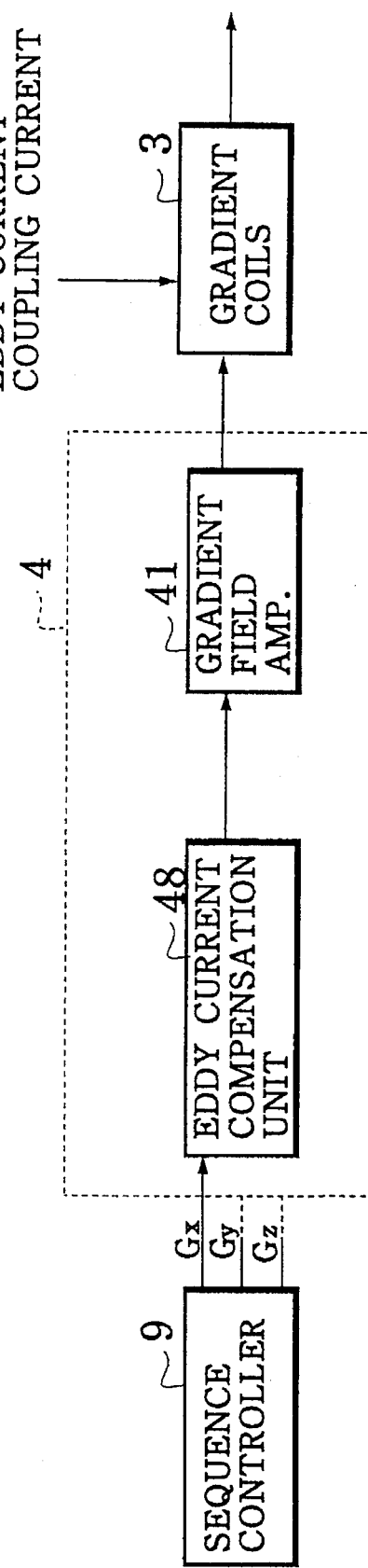

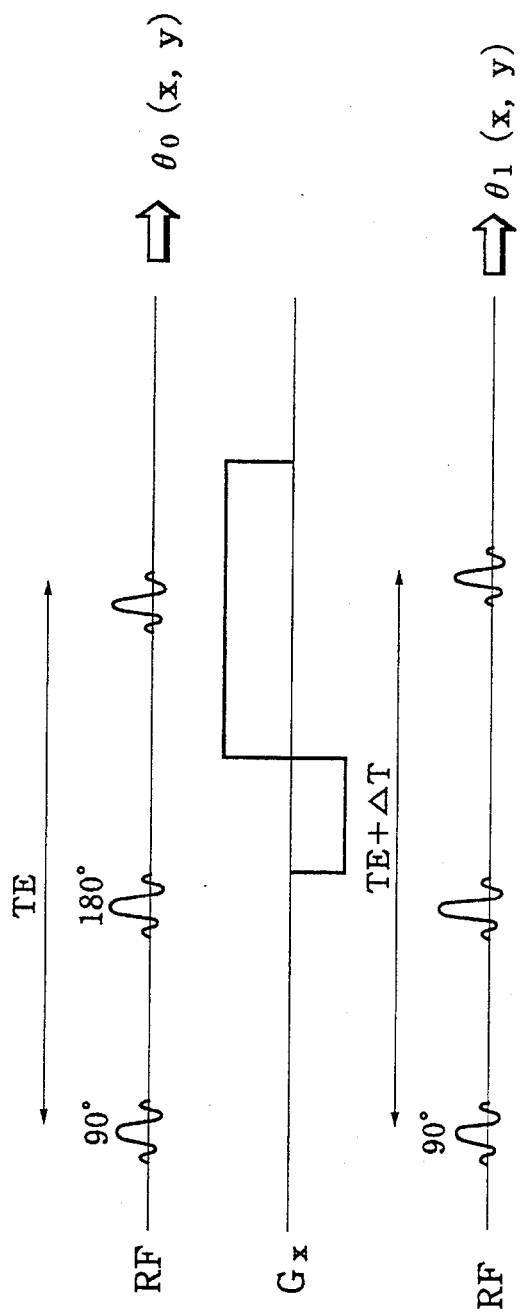
FIG.8A
FIG.8B
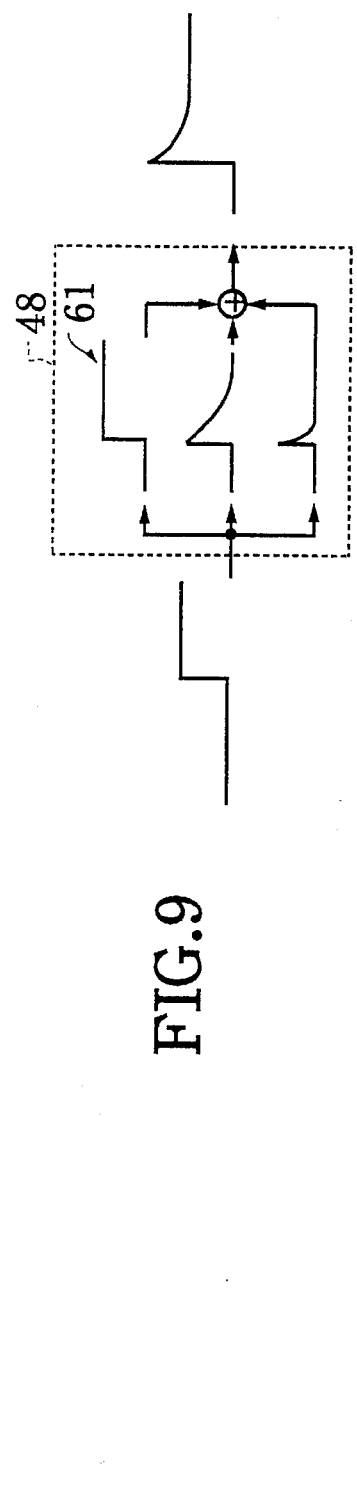
FIG.9

FIG.10

| SYSTEM | INPUT DATA | ADJUSTMENT ITEM |
|---|---|---|
| MAIN MAGNET | · MAGNETIC FIELD HOMOGENEITY | · SHIM COIL SUPPLY CURRENT |
| RF PULSES | · SPATIAL SENSITIVITY OF PROBE<br>· Q-VALUE OF PROBE<br>· LINEARITY OF RF AMP<br>· PATIENT WEIGHT | · INPUT POWER<br>· WAVEFORM |
| GRADIENT MAGNETIC FIELD | · RESPONSE CHARACTERISTIC<br>· SPATIAL LINEARITY OF COIL<br>· EDDY CURRENT MAGNETIC FIELD CHARACTERISTIC<br>· LINEARITY OF GRADIENT COIL POWER SOURCE<br>· MAGNETIC FIELD HOMOGENEITY | · MAGNETIC FIELD STRENGTH<br>· WAVEFORM. |
| TRANSMITTER & RECEIVER | · STATIC MAGNETIC FIELD STRENGTH<br>· PATIENT WEIGHT | · REFERENCE FREQUENCY<br>· AMPLIFIER GAIN<br>· FILTER BANDWIDTH |

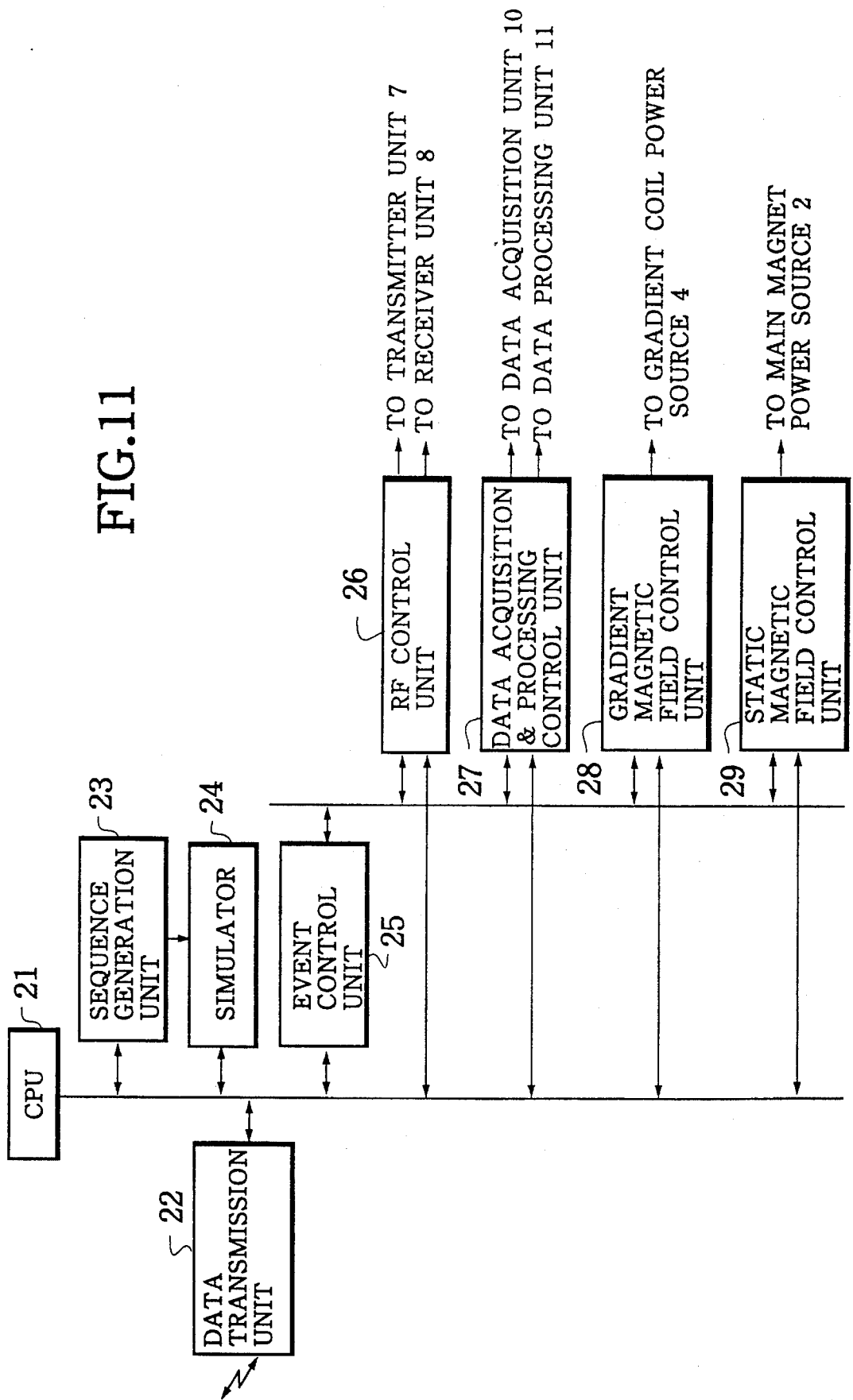

FIG.13A

| NAME | CODE | CONTENT |
|---|---|---|
| · NOP | H00 | · No Operation |
| · SEQS | H01 | · SEQUENCE START (PHASE CONTROL, DAQ CONTROL, RF POSITIONING TIMER RESET) Start address is specified. |
| · SEQE | H02 | · SEQUENCE END (TIMER END) |
| · SEPS | H03 | · SEP MEMORY READ OUT START/END Reading bank No. & address are specified in advance by SEPPUT & triggered. |
| · RFGATE | H04 | · RF GATE CONTROL (ON/OFF) |
| · TXGATE | H05 | · TRANSMITTER GATE CONTROL (ON/OFF) |
| · RXGATE | H06 | · RECEIVER GATE CONTROL (ON/OFF) |
| · GRXS | H07 | · GX MEMORY READ OUT START/END Output is obtained from address & gradient magnetic field strength determined by GRAPUT & GRDPUT in advance. |
| · GRYS | H08 | · GY MEMORY READ OUT START/END |
| · GRZS | H09 | · GZ MEMORY READ OUT START/END |
| · DAQS | H0A | · RAW DATA TAKE IN START/END Data are stored in addresses specified by BUFOFS in advance. |
| · DAQSIG | H0B | · RAW DATA SIGN REVERSAL Sign of data in each data buffer is reversed by calling this before DAQS. |
| · EVTXCG | H0C | · EVENT MEMORY CHANGE (A/B) current channel of event memory is switched. |
| · GRXCG | H0D | · GRADIENT MAGNETIC FIELD MEMORY CHANGE (A/B) Current channel of gradient magnetic field memory is switched. |
| · EVTCLR | H0E | · EVENT MEMORY ADDRESS AND TIMER CLEAR |

FIG.13B

| NAME | CODE | CONTENT |
|---|---|---|
| · FQTOFF | H10 | · TRANSMISSION FREQUENCY OFFSET<br>RESOLUTION : 3.8147Hz |
| · RFPHS | H11 | · PHASE CONTROL<br>RESOLUTION : 0.088° |
| · RFAMP | H12 | · SEP OUTPUT AMPLITUDE CONTROL<br>(PRODUCT WITH COMMAND) |
| · SEPPUT | H13 | · SEP MEMORY START ADDRESS<br>Reading channel is set up before reading of SEP<br>ROM/RAM Bank No. Address |
| · BUFOFS | H14 | · BUFFER MEMORY START OFFSET<br>Data storing address is set up before A/D starts. |
| · FQROFF | H15 | · RECEIVING FREQUENCY OFFSET<br>RESOLUTION : 3.8147Hz |
| · IQPHS | H16 | · PHASE CORRECTION ADDRESS FOR I/Q SPLIT<br>RESOLUTION : 0.088° |
| · GRAPUT | H17 | · GR MEMORY START ADDRESS<br>Reading address is set up before reading of<br>gradient magnetic field memory.<br>Bank Address |
| · GRDPUT | H18 | · GR OUTPUT DATA<br>Amplitude value to be multiplied at a time of<br>reading is set up before reading of gradient<br>magnetic field memory. |
| · EVTDS | H20 | · EVENT DELAY CONTROL |

FIG.14

| ID NO. | | | | | | | | | | |
|---|---|---|---|---|---|---|---|---|---|---|
| NO. OF STEPS | | | | | | | | | | |
| .. | .. | .. | .. | .. | .. | .. | .. | .. | .. | |
| Time | Frq-T | Add | OP-code | Arg1 | Frq-1 | Add/Tgl | Arg2 | Frq-2 | Add/Tgl | |

FIG.15

| Time | OP-code | Argument | Time-flg | OP-flg | Arg-flg |
|---|---|---|---|---|---|
| 32bit | 8bit | 24bit | 8bit | 8bit | 8bit |
| ⋮ | ⋮ | ⋮ | ⋮ | ⋮ | ⋮ |

FIG.16

| Frq | Mode | Now | Inc |
|---|---|---|---|
| | | | |
| ⋮ | ⋮ | ⋮ | ⋮ |

NUCLEAR MAGNETIC RESONANCE IMAGING WITH HIGH SPEED AND INTERACTIVE PULSE SEQUENCE CONTROL

BACKGROUND OF THE INVENTION

1. Field of the Invention

The present invention relates to a nuclear magnetic resonance imaging, and more particularly, to an improvement on a pulse sequence control for controlling generation, adjustment, and execution of a pulse sequence used in the nuclear magnetic resonance imaging.

2. Description of the Background Art

The nuclear magnetic resonance imaging is a technique for imaging microscopic chemical or physical information of an imaging target object by utilizing the so called nuclear magnetic resonance phenomenon according to which the nucleus having a characteristic magnetic moment placed in a homogeneous static magnetic field can resonantly absorb the energy of the high frequency magnetic field of a specific resonant frequency.

This nuclear magnetic resonance imaging is quite time consuming compared with other medical diagnostic imaging techniques such as an ultrasonic wave diagnostic imaging and an X-ray CT (Computed Tomography). As a consequence, the nuclear magnetic resonance imaging has been disadvantageous in that the image artifact can be caused easily by the respiration of the patient, and that it is rather difficult to image a moving target object such as a heart and a blood vessel. In addition, because of the lengthy imaging time required, it can be rather painful to the patient.

Now, the image artifact in the nuclear magnetic resonance imaging can be attributed partly to a factor related to the incompleteness of the radio frequency (RF) magnetic field and the gradient magnetic field, and partly to a factor related to the motion on the patient side. Of these two factors, the factor related to the motion on the patient side such as the body motion of the patient or the blood flow within the patient's body can be reduced to some extent by devising the appropriate pulse sequence.

On the other hand, the incompleteness of the RF magnetic field is due to the non-linearity of an RF amplifier and an inhomogeneity of the RF, magnetic field, while the incompleteness of the gradient magnetic field is due to electric capacity factors of the gradient field amplifier, field distribution factors and inductance factors of the gradient field coils, as well as a transient factor such as an eddy current factor.

In order to compensate these incompleteness factors and minimize the image artifact, it is necessary to carry out the pulse sequence adjustment. However, because the contributions of various factors vary depending on the type of pulse sequence to be used, the pulse sequence adjustment must be made every time an imaging apparatus component such as the probe coil and the gradient field coils is changed. Consequently, the maintenance of the apparatus for the nuclear magnetic resonance imaging can be quite cumbersome as the number of different types of the pulse sequence to be used in the nuclear magnetic resonance imaging increases.

In addition, in the high speed (or ultra high speed) imaging method such as EPI (Echo Planar Imaging), FLASH (Fast Low Angle SHot), and Turbo FLASH which is capable of reducing the required imaging time, much larger image artifacts can be caused easily by a slight inhomogeneity of the static magnetic field or a slight deviation of the gradient field switching timing, compared with an ordinary imaging method such as the spin echo (SE) imaging. For this reason, it is preferable to carry out the adjustments of the magnetic fields and the pulse sequence for each patient, before taking the actual image. However, such adjustments require the execution of the pre-scanning solely for that purpose, and this in turn increases the required time for the image taking procedure as a whole.

Furthermore, such a high speed (or ultra high speed) imaging method has the problem in that, as the pulse sequence of such a high speed imaging method becomes faster and more complicated, it has become impossible to make a sufficient event control for the pulse sequence by the conventionally available sequence controller.

Namely, there are two conventionally known procedures for the event control by the sequence controller, as follows.

(1) The pulse sequence data for taking a single image including a wait period due to the repetition time TR are stored in the event memory, and then the stored pulse sequence on the event memory is executed. In this procedure, the host computer side does not at all participate in the pulse sequence execution. In other words, all the operations to be executed for obtaining a single image are stored in the event memory first, and then the pulse sequence is actually executed according to the event memory by the sequence controller, quite independently from the host computer.

(2) The pulse sequence data for only a limited number of RF excitations is stored in the event memory, and then the portions of the event memory related to the encoding steps and the multi-slices are rewritten during the wait period due to the repetition time TR. In other words, the basic procedure is predetermined, and the specific parameters of this basic procedure are sequentially rewritten during the wait period while the pulse sequence is executed sequentially.

However, the procedure (1) has the problem in that the amount of data for the pulse sequence that can be stored in the event memory simultaneously is actually limited in practice, and the event memory in the conventionally available sequence controller may not have a sufficient memory capacity to deal with the highly complicated pulse sequence, or else the length of the pulse sequence such as that specified by the number of encoding steps must heavily depend upon the memory capacity of the event memory.

In addition, the procedure (1) also has the problem in that the control is not handed over to the host computer side at all during the execution of the pulse sequence, so that the operation to transmit the acquired data to the host computer side cannot be carried out until the entire pulse sequence is finished, and consequently the time available for the image re-construction on the host computer side could be quite limited.

Despite of all these drawbacks, for the ultra high speed imaging method such as Turbo FLASH which has a very short repetition time TR, only this procedure (1) is applicable.

On the other hand, the procedure (2) is advantageous in that it can deal with any complicated pulse sequence by utilizing the rewriting of the event memory, and the transmission of the acquired data can be made during the event memory rewriting operation.

However, this procedure (2) has the problem in that, in order to minimize the repetition time TR, it becomes necessary to provide the hardware for effectively shortening the rewriting process of the event memory and the data structure for effectively minimizing the number of steps required in the rewriting operation, but such hardware and the data structure have been unknown. Also, there are some rather complicated pulse sequences for which the repetition time TR cannot be shortened very much.

Also, in the high speed imaging method such as EPI, it is desirable to execute the pulse sequence interactively, such that the imaging slice plane can be changed sequentially according to the commands entered from the host computer side by the operator for example, so as to take a full advantage of the instantaneous imaging achievable by such a high speed imaging method.

However, such a high speed imaging method requires a very large pulse sequence data set, so that in the conventional event memory rewriting procedure (2) involving the direct participation of the host computer side, the rewriting of the event codes cannot be completed within an ordinary repetition time TR (about 100 ms). In other words, it has been impossible conventionally to sufficiently speed up the operations for rewriting the event memory, such that it has been difficult to realize the interactive pulse sequence execution even when the high speed imaging method capable of obtaining the continuous real time images is employed.

In addition, in the conventional sequence controller, because of the low time resolution realizable, the adjustment of the pulse sequence has been achieved in terms of the amplitude level of the gradient magnetic field, but this procedure for the adjustment of the pulse sequence can be affected by the eddy currents more easily compared with a case of controlling the pulse sequence with the fixed amplitude on the time axis, so that it is not suitable for the high precision adjustment of the pulse sequence.

SUMMARY OF THE INVENTION

It is therefore an object of the present invention to provide a method and an apparatus for pulse sequence control in nuclear magnetic resonance imaging, capable of controlling the generation of a desired pulse sequence to be used interactively.

It is another object of the present invention to provide a method and an apparatus for pulse sequence control in nuclear magnetic resonance imaging, capable of realizing the adjustment of the pulse sequence easily and accurately.

It is another object of the present invention to provide a method and an apparatus for pulse sequence control in nuclear magnetic resonance imaging, capable of realizing the high speed pulse sequence execution.

According to one aspect of the present invention there is provided a method for pulse sequence control in nuclear magnetic resonance imaging, comprising the steps of: storing basic pulse sequence forms specifying pulse sequence parameters unaffected by imaging conditions for a plurality of pulse sequence types; selecting one of the basic pulse sequence forms corresponding to a desired pulse sequence type; storing a parameter block containing pulse sequence parameters affecting the imaging conditions; specifying desired imaging conditions to update the pulse sequence parameters in the parameter block; and automatically generating a desired pulse sequence from said one of the basic pulse sequence forms selected at the selecting step and the parameter block updated at the specifying step.

According to another aspect of the present invention there is provided a method for pulse sequence control in nuclear magnetic resonance imaging, comprising the steps of: measuring characteristic parameters affecting a pulse sequence; simulating an execution of the pulse sequence by using simulated RF pulses, simulated gradient magnetic fields, simulated static magnetic field, and simulated nuclear spin density distribution, according to the characteristic parameters measured at the measuring step; and automatically adjusting the pulse sequence to an optimum setting according to a result of a simulation at the simulating step.

According to another aspect of the present invention there is provided an apparatus for pulse sequence control in nuclear magnetic resonance imaging, comprising: basic pulse sequence form table means for storing basic pulse sequence forms specifying pulse sequence parameters unaffected by imaging conditions, for a plurality of pulse sequence types; parameter block means for storing pulse sequence parameters affected the imaging conditions; input means for selecting one of the basic pulse sequence forms corresponding to a desired pulse sequence type and specifying desired imaging conditions to update the pulse sequence parameters in the parameter block means; and pulse sequence generation means for automatically generating a desired pulse sequence from said one of the basic pulse sequence forms selected by the input means and the parameter block means updated by the input means.

According to another aspect of the present invention there is provided an apparatus for pulse sequence control in nuclear magnetic resonance imaging, comprising: measurement means for measuring characteristic parameters affecting a pulse sequence; simulator means for simulating an execution of the pulse sequence by using simulated RF pulses, simulated gradient magnetic fields, simulated static magnetic field, and simulated nuclear spin density distribution, according to the characteristic parameters measured by the measurement means; and pulse sequence adjustment means for automatically adjusting the pulse sequence to an optimum setting according to a result of a simulation obtained by the simulator means.

Other features and advantages of the present invention will become apparent from the following description taken in conjunction with the accompanying drawings.

BRIEF DESCRIPTION OF THE DRAWINGS

FIGS. 3A and 3B are illustration of a parameter block to be used in the pulse sequence generation section in the flow chart of FIG. 2.

FIG. 5 is a schematic block diagram of an RF pulse generating system in the apparatus of FIG. 1.

FIG. 6 is a schematic block diagram of a gradient magnetic field generating system in the apparatus of FIG. 1.

FIGS. 8A and 8B are pulse sequence timing charts for explaining a manner of measuring a magnetic field distribution.

FIG. 9 is a schematic block diagram of an eddy current compensation unit in the gradient magnetic field generating system of FIG. 6.

FIG. 10 is a table summarizing exemplary pulse sequence adjustment according to the pulse sequence adjustment section in the flow chart of FIG. 2.

FIG. 11 is a block diagram of a sequence controller in the apparatus of FIG. 1.

FIGS. 13A and 13B are tables summarizing the operation codes to be used in an event memory in the event control unit of FIG. 12.

FIG. 14 is an illustration of a fully developed data structure of the event table used in the event control unit of FIG. 12.

FIG. 15 is an illustration of a data structure in the event memory in the event control unit of FIG. 12.

FIG. 16 is an illustration of a data structure of a rewriting table used in the event control unit of FIG. 12.

DETAILED DESCRIPTION OF THE PREFERRED EMBODIMENTS

Figure 1:
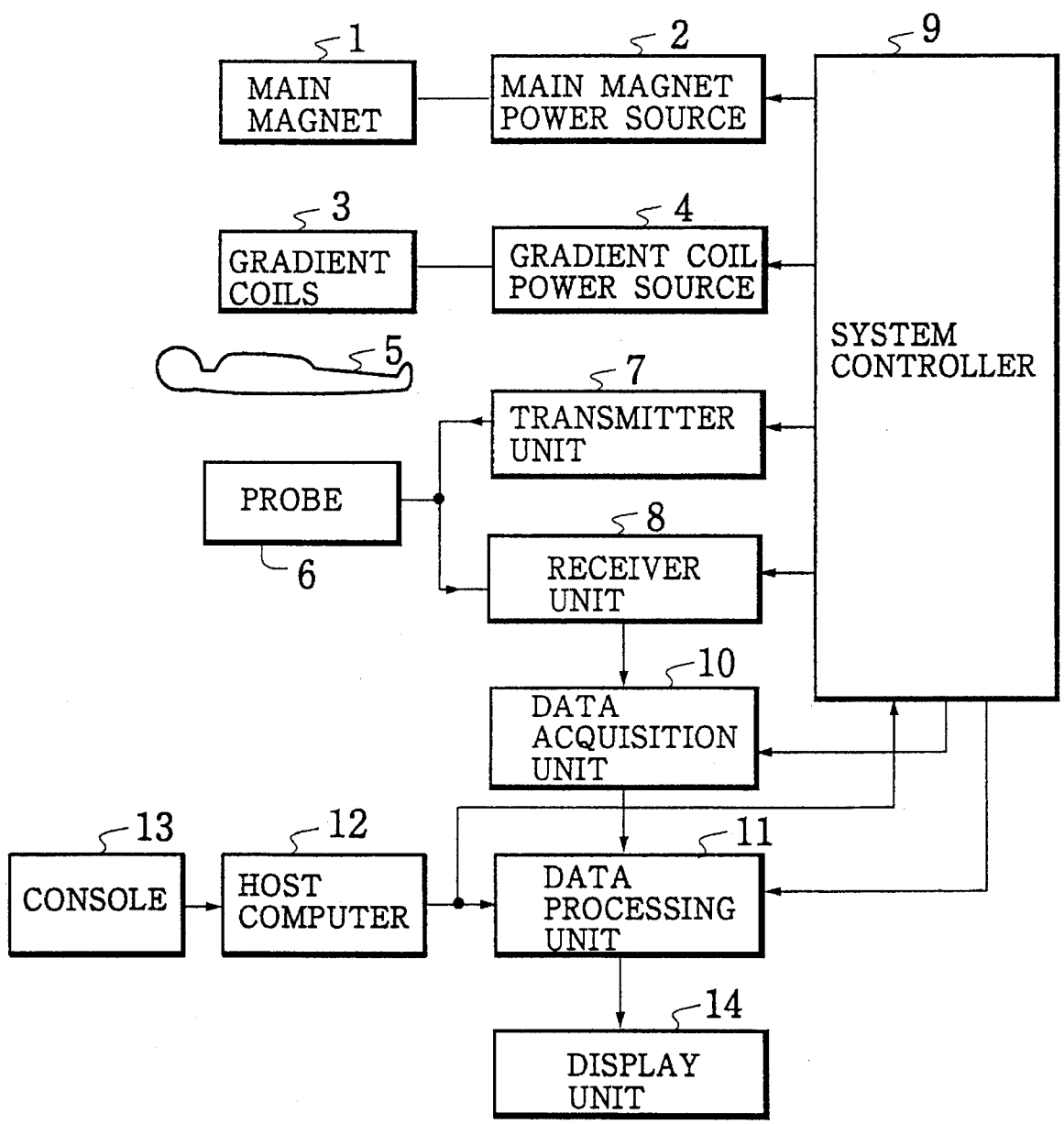
FIG. 1 is a schematic block diagram of a nuclear magnetic resonance imaging apparatus for realizing one embodiment of a method for pulse sequence control according to the present invention.

Referring now to FIG. 1, a nuclear magnetic resonance imaging apparatus for realizing one embodiment of a method for pulse sequence control in a nuclear magnetic resonance imaging according to the present invention will be described in detail.

In this configuration shown in FIG. 1, the apparatus comprises: a main magnet 1 for generating a static magnetic field; a main magnet power source 2 for driving the main magnet 1; gradient coils 3 for generating appropriate reading, slicing, and phase encoding gradient magnetic fields Gr, Gs, and Ge; a gradient coil power source 4 for driving the gradient coils 3; a probe 6 for applying radio frequency (RF) pulses to the patient 5 and receiving nuclear magnetic resonance (NMR) signals from the patient 5; a transmitter unit 7 for driving the probe 6 to transmit the desired RF pulses; a receiver unit 8 for detecting the NMR signals received by the probe 6; a data acquisition unit 10 for collecting and A/D converting the NMR signals detected by the receiver unit 8; a data processing unit 11 for data processing the A/D converted NMR signals to reconstruct the desired NMR image; a system controller 9 for controlling the operations of the main magnet power source 2, the gradient coil power source 4, the transmitter unit 7, the receiver unit 8, the data acquisition unit 10, and the data processing unit 11; a display unit 14 for displaying the NMR image reconstructed by the data processing unit 11; a console 12 from which an operator enters various control commands; and a host computer 13 for controlling the system controller 9 and the data processing unit 11 interactively according to the control commands entered from the console 12. Here, the probe 6 may be either one of an integrated transceiver type or separate transmitter and receiver type.

In this apparatus of FIG. 1, the patient 5 is placed inside the static magnetic field generated by the main magnet 1, and three orthogonal gradient magnetic fields generated by the gradient coils 3 are superposed onto the static magnetic field while the RF pulses are applied by the probe 6, according to the desired imaging pulse sequence realized by the controlling of the sequence controller 9. Then, the NMR signals emitted from the patient 5 in response to the application of the RF pulses are received by the probe 6, according to which the data processing unit 11 reconstructs the desired NMR images by using appropriate data processing operations such as the Fourier transformation.

Figure 2:
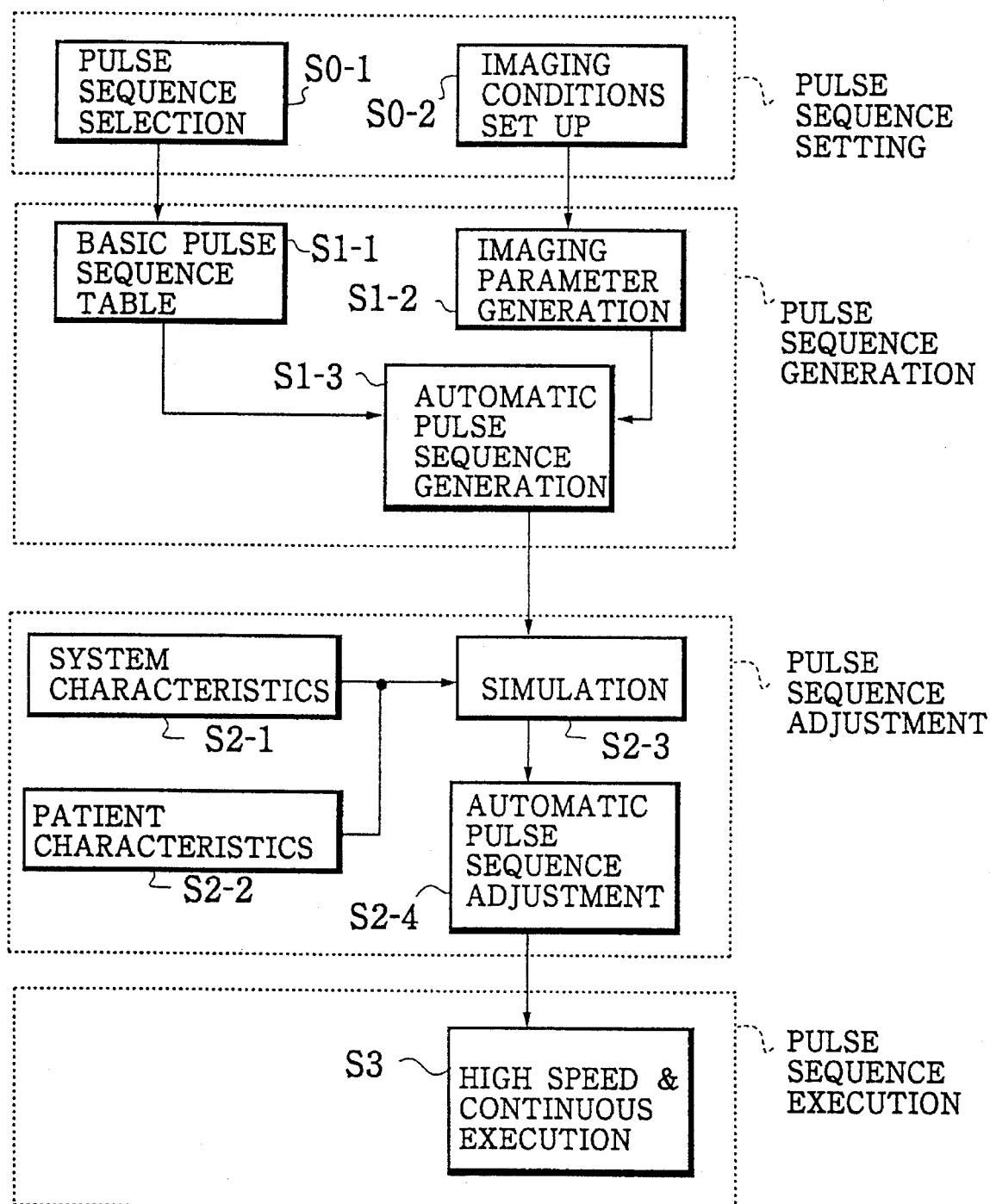
FIG. 2 is a functional flow chart for one embodiment of the method for pulse sequence control according to the present invention to be carried out by the apparatus of FIG. 1.

Now, an overview of the method for the pulse sequence control in a nuclear magnetic resonance imaging according to the present invention will be described in accordance with a functional flow chart shown in FIG. 2.

First at the pulse sequence setting section, a desired pulse sequence type is selected at the step S0-1 and desired imaging conditions such as imaging region, imaging direction, etc. are specified at the step S0-2, by the operator through the console 13.

Next, at the pulse sequence generation section, the basic pulse sequence form for the desired pulse sequence type selected at the step S0-1 is read out from a basic pulse sequence table at the step S1-1, while the imaging parameters corresponding to the desired imaging conditions specified at the step S0-2 are generated at the step S1-1, at the host computer 12. Then, at the step S1-3, the host computer 12 automatically generates the appropriate pulse sequence at the step S1-3 and transmits the generated pulse sequence to the system controller 9, in a manner described in detail below.

Next, at the pulse sequence adjustment section, the system characteristics of the nuclear magnetic resonance imaging apparatus shown in FIG. 1 are measured in advance at the step S2-1, while the patient characteristics are measured in advance at the step S2-2. Then, the sequence controller 9 carries out the simulation of the pulse sequence execution by using the simulated RF pulse waveform, the simulated gradient magnetic field waveform, the simulated static magnetic field, and the simulated nuclear spin density distribution at the step S2-3 according to the pulse sequence generated at the step S1-3, the system characteristics measured at the step S3-1, and the patient characteristics measured at the step S3-2. Then, the sequence controller 9 automatically adjusts the pulse sequence appropriately at the step S2-4 according to the result of the simulation obtained at the step S2-3, in a manner described in detail below.

Finally, at the pulse sequence execution section, the high speed and continuous pulse sequence execution is realized at the step S3 by the system controller 9, by speeding up the operations related to the decoding of the event codes and the rewriting of the event memory, in a manner described in detail below.

Now, the pulse sequence generation section in the functional flow chart of FIG. 2 will be described in detail.

Figure 3B:
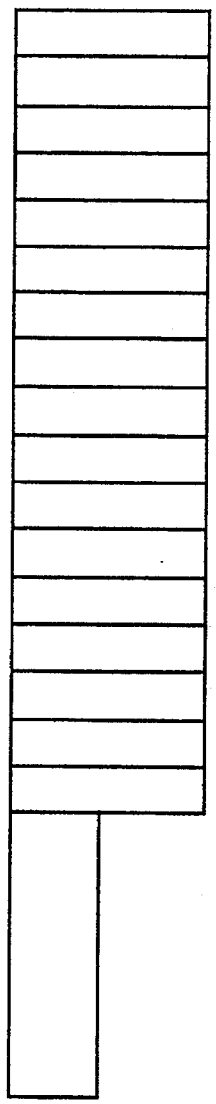

In this embodiment, each of the host computer 12 and the sequence controller 9 is equipped with a parameter block having a data structure as shown in FIGS. 3A and 3B. This parameter block specifies the imaging parameters corresponding to the desired imaging conditions specified by the operator, such as the time parameters including the repetition time TR and the echo time TE, the imaging region size, and other parameters related to the imaging conditions.

In addition, the host computer 12 is also equipped with the basic pulse sequence table containing the definition of the basic form of the pulse sequence for each pulse sequence type.

Then, when the desired pulse sequence type and the desired imaging conditions are entered from the console 13 by the operator, the host computer 12 automatically generates the appropriate pulse sequence by using the parameter block and the basic pulse sequence table, and transmits the generated pulse sequence to the sequence controller 9 in a form of an event table to be stored in the event memory in the sequence controller 9 which will be described in detail below. In a case the rewriting of the event memory is incorporated, the host computer 12 also generates a rewriting table to be described in detail below along with the event table.

Here, the imaging parameters of the pulse sequence affected by the imaging conditions are collectively managed by the parameter block, while the basic forms of the pulse sequence for different pulse sequence types which are unaffected by the imaging conditions are collectively managed by the basic pulse sequence table, and the actual pulse sequence can be generated automatically by the host computer 12 by using the parameter block and the basic pulse sequence table, so that the change of the pulse sequence can be achieved at high speed by simply specifying the imaging parameters to be changed in the parameter block alone.

As a result, there is no need to provide an entire pulse sequence in correspondence to each one of the different settings of the image conditions such as the different imaging regions and the different repetition times, or to provide a procedure for rewriting the entire pulse sequence whenever the imaging conditions are changed.

Consequently, it becomes possible in this embodiment to realize the high speed interactive pulse sequence setting operation easily, by entering the desired imaging conditions from the console 13 sequentially, and changing the imaging parameters in the parameter block accordingly, and then automatically generating the actual pulse sequence.

In particular, when the high speed imaging method such as Turbo FLASH and EPI is used, the imaging conditions set up by the operator through the console 13 can be reflected immediately in the next image, so that it becomes possible to realize the real time interactive pulse sequence set up procedure.

To be specific, the imaging parameters in the parameter block can be changed in the following manners, for example.

(1) TR

The repetition time TR is controlled by using a combination of a real time OS and a real time timer provided in the host computer 12, so that the timer value appropriate for setting up the interruption at the scheduler side is changed accordingly.

(2) TE

The echo time can be changed by rewriting the imaging parameters to be the arguments of the delay commands in the event memory provided in the sequence controller.

(3) RF power condition

The RF power can be changed according to the desired RF power specified by the operator from the console 13.

(4) Field of view (FOV) size

Figure 4:
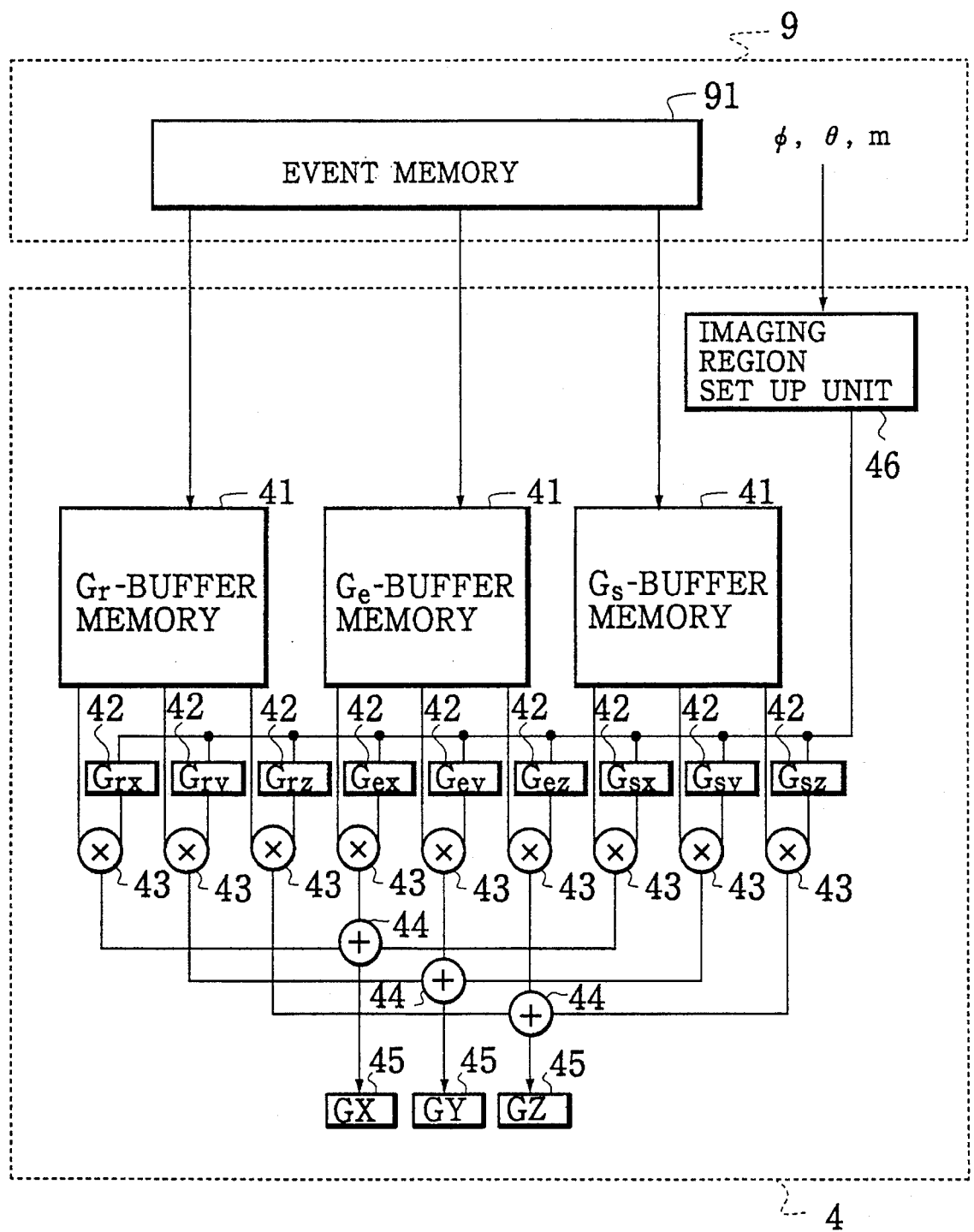
FIG. 4 is a block diagram of a gradient coil power source in the apparatus of FIG. 1 for explaining the exemplary change of the parameters in the parameter block of FIGS. 3A and 3B.

In this embodiment, as shown in FIG. 4, the gradient coil power source 4 is equipped with the registers 42 for specifying appropriate mixing rates of the reading, encoding, and slicing gradient magnetic fields outputted by the Gr, Ge, and Gs buffer memories 41 controlled by the event memory 91 provided in the sequence controller 9, multipliers 43 and adders 44 for mixing the reading, encoding, and slicing gradient magnetic fields, GX, GY, and GZ amplifiers 45 for driving the gradient coils 3 by the reading, encoding, and slicing gradient magnetic fields mixed by the multipliers 43 and the adders 44, and an imaging region set up unit 46 for specifying the register values for the registers 42 according to a magnification rate m specified from the sequence controller 9.

Consequently, the field of view size can be changed by changing the imaging parameter specifying the magnification rate appropriately.

(5) Oblique slicing plane

Using the same configuration as shown in FIG. 4, the oblique slicing plane can be set up by changing the variables $\phi$ and $\theta$ defining the oblique slicing plane which are to be supplied to the imaging region set up unit 46 from the sequence controller 9, such that the register values of the registers 42 are changed according to these variables $\phi$ and $\theta$ specified from the sequence controller 9.

Next, the pulse sequence adjustment section in the functional flow chart of FIG. 2 will be described in detail.

In this embodiment, the pulse sequence adjustment is carried out in three steps including a characteristic parameter measurement step, a simulation step, and an adjustment step.

In the first step of characteristic parameter measurement, the characteristic parameters affecting the execution of the pulse sequence in the following two categories are measured.

(1) System characteristic parameters including:

(i) Transmission characteristics of an RF amplifier in the transmitter unit 7 (to be measured for each probe coil as it depends on the Q-value of a probe coil used in the probe 6).

(ii) Amplitude characteristic of the RF pulses such as a spatial power distribution, a frequency characteristic, and a phase characteristic.

(iii) Transmission characteristics of the gradient coils 3 such as a gradient field amplifier characteristic, a gradient coil characteristic, a spatial non-linearity of the gradient coils 3, an eddy current magnetic field characteristic, and an inhomogeneity of the static magnetic field due to the system configuration.

These system characteristic parameters are determined by the system configuration of the nuclear magnetic resonance imaging apparatus to be used alone, so that they can be measured in advance and stored in a form of a database.

More specifically, the system characteristic parameters can be measured as follows.

Namely, as shown in FIG. 5, an RF pulse generating system in the apparatus of FIG. 1 comprises: the sequence controller 9 which generates the modulated waves; the transmitter unit 7 which receives the modulated waves from the sequence controller 9 and the resonant frequency $f_0$ from a frequency synthesizer (not shown), including an RF transmitter 52 for synthesizing the control waveform $g_1(t)$ by using the supplied modulated waves and the resonant frequency $f_0$, and an RF amplifier 58 for amplifying the control waveform $g_1(t)$ generated by the RF transmitter 52 to obtain the RF pulse signals $g_2(t)$ to be supplied to the probe 6; and the probe 6 for applying the RF pulses $g_3(t)$ to the patient 5. The transmission characteristics of these components are measured for each component separately, as well as for these components together. The characteristics for the probe 6 must be measured for each type of a probe coil used in the probe 6, because the radiation characteristics are different for different probe coils.

On the other hand, as shown in FIG. 6, a gradient magnetic field generating system in the apparatus of FIG. 1 comprises: the sequence controller 9 for generating the control waveform for each channel of the gradient magnetic fields; the gradient coil power source 4 having an eddy current compensation unit 48 for making the eddy current compensation and the gradient field amplifiers 41 which supplies the gradient coil driving power to the gradient coils 3. The transmission characteristics of these components are measured for each component separately, as well as for these components together. The eddy current magnetic field characteristic due to the eddy current compensation unit 55 and the spatial non-linearity of the gradient coils 3 are also measured.

Figure 7A:
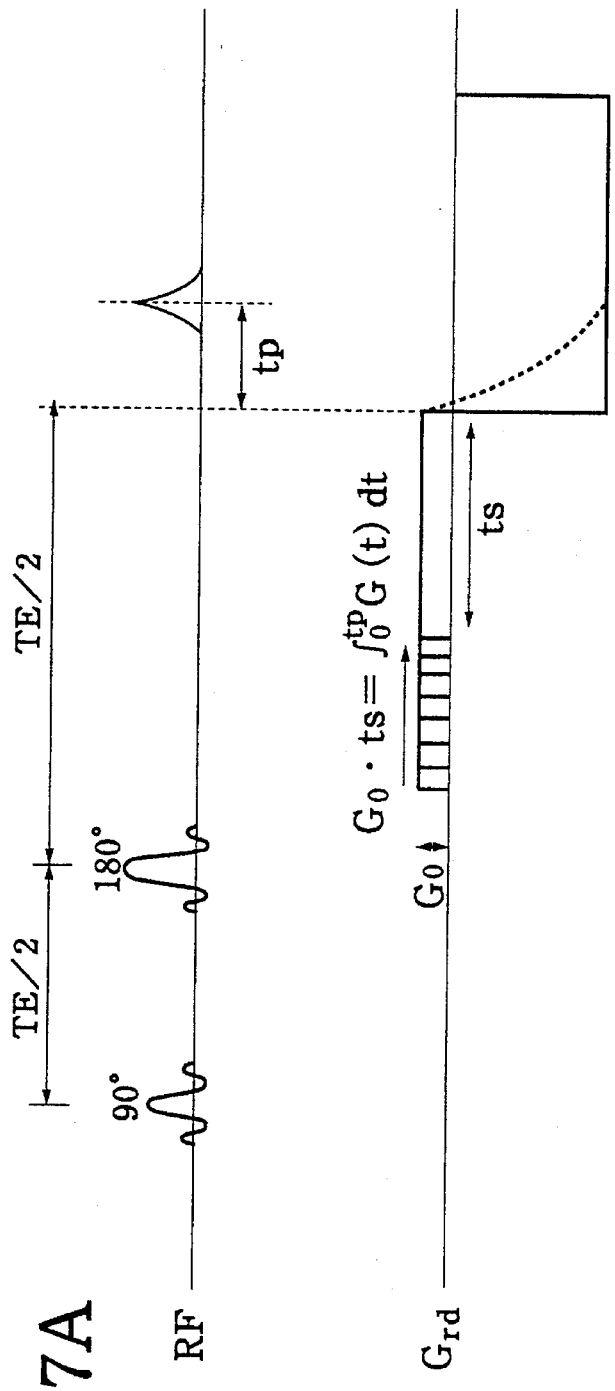
FIGS. 7A and 7B are a pulse sequence timing chart and a graph for explaining a manner of determining the transient response.
Figure 7B:
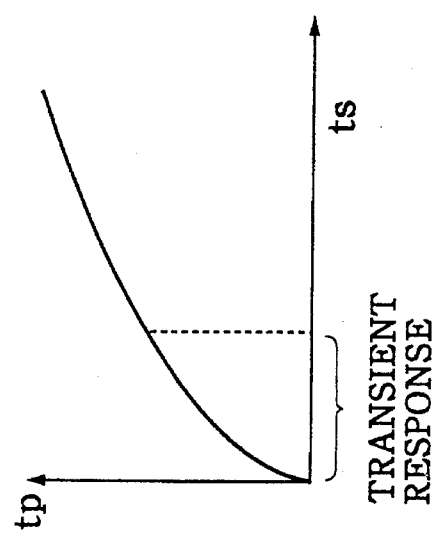

The measurement of the RF and gradient magnetic fields can be achieved by using a search coil to measure the differential value of the magnetic field strength, from which the magnetic field strength can be obtained as an integrated value. Also, for the gradient magnetic fields, the transient response can be determined accurately as indicated in FIGS. 7A and 7B, by measuring the echo peak time tp of the echo signal occurring at a time the integrated value of the gradient magnetic fields becomes zero, by utilizing the property of the spin echo. Here, the gradient magnetic fields in a small amplitude level $G_0$ in which the rise time is ignorable is applied to the positive side for a number of different time periods ts, and the echo peak times tp for the echo signal occurring after the gradient magnetic fields are switched to the negative side are plotted as shown in FIG. 7B.

(2) patient characteristic parameters including:
(i) RF power condition (90° pulse condition).
(ii) Inhomogeneity of the static magnetic field due to the presence of the patient.
(iii) Size of the patient.

These patient characteristic parameters must be measured for each imaging, as the absorption rate of the RF pulses and the eddy current magnetic field can vary for different patients 5 or different imaging target portions in the patient 5.

The RF power condition must be specified for every pulse sequence, and in particular, it is necessary to specify the RF power accurately for the IR pulses. Here, however, by measuring and storing the various RF power conditions for each imaging target portion and each weight class of the patient in advance, it becomes possible to minimize the number of pre-scannings required for the RF power condition setting.

The static magnetic field distribution can be measured accurately, as shown in FIGS. 8A and 8B, by taking two sets of the images (using the spin echo scheme or the double echo scheme) using slightly different echo times TE and TE $+\Delta T$, and by estimating the static magnetic field distribution according to the difference between the phases $\theta_0$ and $\theta_1$ for these two sets of the images. The static magnetic field distribution so determined can then be utilized in adjusting the shim coil current strength, so as to improve the homogeneity of the static magnetic field. This adjustment of the static magnetic field is particularly important for the high speed imaging method such as EPI which can easily be affected by the inhomogeneity of the static magnetic field.

Next, in the second step of simulation, the simulation of the pulse sequence execution using the simulated RF pulse waveform, the simulated gradient magnetic field waveforms, the simulated static magnetic field, and the simulated nuclear spin density distribution is carried out according to the system and patient characteristic parameters obtained by the characteristic parameter measurement step described above, as follows.

First, the spin motion due to the application of the RF pulses can be calculated from the following Bloch equation (1).

$$dM/dt = \gamma M \times B - (iM_x + jM_{6S})/T_2 + k(M_0 - M_z)/T_1 \quad (1)$$

where M is a magnetic moment of the spin, $\gamma$ is the gyromagnetic ratio of the spin, $T_1$ is a longitudinal relaxation time, $T_2$ is a transverse relaxation time, i, j, and k are unit vector in X, Y, and Z directions, and the magnetic field B is given by the following two equations (2) and (3).

$$B = kB_0' + B_1 \quad (2)$$

$$B_0' = B_0 + \Delta B + G \cdot r \quad (3)$$

where $B_0$ is the static magnetic field, $B_1$ is an input waveform of the RF pulses, $\Delta B$ is an inhomogeneity of the static magnetic field, G is the gradient magnetic field strength, and r is a radial position.

Thus, the magnetic moment M of the spin at each time t can be calculated by using the simulated RF pulse waveform, the simulated gradient magnetic field waveforms, and the simulated static magnetic field. Consequently, the slice characteristics and the signal strength at the time of the application of the RF pulses can be calculated.

On the other hand, the echo signal S(t) can be expressed by the following equation (4).

$$S(t) = \iint \rho(x, y) \cdot \exp[-2\pi\gamma j\{G_x(x, y, t)x + G_y(x, y, t) + \Delta B(x, y)t\}] dxdy \quad (4)$$

where $\rho$ is the simulated nuclear spin density distribution, and $G_x$ and $G_y$ are the integrated waveforms of the gradient magnetic field strengths in X and Y directions given by the Following equations (5) and (6).

$$G_x(x, y, t) = \int g_x(x, y, t) dt \quad (5)$$

$$G_y(x, y, t) = \int g_y(x, y, t) dt \quad (6)$$

where $g_x$ and $g_y$ are the gradient magnetic field waveforms in the X and Y directions.

Thus, the echo signal S(t) can be calculated from the simulated gradient magnetic field waveforms $g_x$ and $g_y$, the simulated static magnetic field, and the simulated nuclear spin density distribution.

Here, the simulated RF pulse waveform, the simulated gradient magnetic field waveforms, the simulated static magnetic field, and the simulated nuclear spin density distribution should be obtained by the sufficiently high performance computer device such that the simulation can be made in a relatively short period of time compared with the actual image taking time.

Next, in the third step of adjustment, the adjustment of the pulse sequence according to the result of the simulation obtained at the simulation step described above is made as follows.

First, for the RF pulses, in a case of adjusting the homogeneity of the magnetic field to be lower than a prescribed value determined by the RF pulse application time, the factor concerning the homogeneity of the static magnetic field can be dropped in the above described calculation of the spin motion according to the Bloch equation.

Also, when the assumed density $\rho$ used in the calculation of the spin motion is determined from the standard image for each imaging portion, the slice characteristic can be determined accurately.

Thus, in the first order approximation, the spin motion and the slice characteristic can be calculated from the standard image for each imaging portion, the characteristics of each probe, and the simulated gradient magnetic field waveforms, so that they can be determined and stored in a form of a database.

For example, the non-linearity of the amplitude level can be easily realized by multiplying the linearizing function for each probe with the selective excitation pulse waveform.

The finer adjustment of the slice characteristic can be achieved by using the magnetic fields after the magnetic field adjustment in the Bloch equation.

In practice, the realizable level of the adjustment depends on the performance level of the sequence controller 9. Namely, for the RF pulses, it is easy to control the output amplitude so as to compensate the non-linearity of the amplitude level, but the adjustment of the frequency characteristic and the phase characteristic which are required in the finer adjustment can be realized only when the high level sequence controller is used.

Similarly, for the gradient magnetic fields, there is no need to make the correction for the image artifact due to the inhomogeneity of the static magnetic field when the pulse sequence is not very susceptible to the magnetic field inhomogeneity, such as a case of the spin echo imaging method.

On the other hand, by utilizing the simulated gradient magnetic fields as a measurement tool for measuring the homogeneity of the magnetic field, the high precision measurement of the magnetic field distribution can be made.

Thus, in the first order approximation, the echo signal $S(t)$ can be calculated by the equation (4) by using the density $\rho$ of a prescribed virtual phantom, along with the integrated waveforms $G_x$ and $G_y$ of the gradient magnetic field strengths in X and Y directions obtained from the transmission characteristics of the gradient magnetic fields accounting for the influence of the eddy currents under the condition of keeping the magnetic field homogeneity below a prescribed value.

Then, the gradient magnetic field waveforms are adjusted such that the norm of the echo signal $S(t)$ in the k-space has the maximum value at the origin of the k-space.

In addition, the echo signal $S(t)$ is calculated again by the equation (4) by using the influence of the residual magnetic field distribution after the magnetic field homogeneity adjustment. In this manner, the inhomogeneity of the gradient magnetic fields can be removed up to the first order components.

In a case of using the rectangular waveform for the gradient magnetic field control, the eddy current compensation unit 48 having a configuration as shown in FIG. 9 can be utilized. In this eddy current compensation unit 48 of FIG. 9, the input rectangular waveform is modulated by adding the exponentially decaying waveforms generated by a plurality of RC circuit 61 having different time constants, so as to obtain the control waveform with the improved rising time. When the gradient magnetic field waveforms are calculated from the transmission characteristics accounting for the eddy current compensation, the positioning of the signal peak can be made by sequentially changing the amplitude level and the timing of the rectangular input waveform until the integrated value of the echo signal $S(t)$ falls within the appropriate range.

In the high speed imaging method such as EPI, unlike the ordinary imaging method such as the spin echo, the pulse sequence becomes quite lengthy, so that the adjustment as described above is particularly effective. In such a case, as the switching of the gradient magnetic fields are repeated, the gain of the gradient field amplifier is to be reduced gradually.

In summary, the typical adjustment items for various systems in the nuclear magnetic resonance imaging apparatus and the various input data required for them are enumerated in the table shown in FIG. 10.

According to the pulse sequence adjustment section in this embodiment described above, the number of pre-scannings for the pulse sequence adjustment can be minimized, so that the required image taking time as a whole can be shortened, while reducing an amount of RF pulses and the gradient magnetic fields to be applied onto the patient.

In addition, by preparing the database for the system characteristic parameters, the standard pulse sequences prepared at the manufacturer's factory can easily be adapted optimally to the individual site of the practical use, by utilizing the automatic pulse sequence adjustment as described above.

Next, the pulse sequence execution section in the functional flow chart of FIG. 2 will be described in detail.

First, referring to FIG. 11, a detail configuration of the sequence controller 9 in this embodiment will be described.

Namely, in this embodiment, the sequence controller 9 comprises: a CPU 21 for controlling the operation of the sequence controller 9 as a whole; a data transmission unit 22 for transmitting data with respect to the host computer 12; a sequence generation unit 23 used in the pulse sequence generation section described above; a simulator 24 used in the pulse sequence adjustment section described above; an event control unit 25 having a plurality of event memories for storing the event tables in terms of the event codes; an RF control unit 26 for controlling the transmitter unit 7 and the receiver unit 8; a data acquisition and processing control unit 27 for controlling the data acquisition unit 10 and the data processing unit 11; a gradient magnetic field control unit 28 for controlling the gradient field power source 4; and a static magnetic field control unit 29 for controlling the main magnet power source 2.

Here, the RF control unit 26, the data acquisition control unit 27, the gradient magnetic field control unit 28, and the static magnetic field control unit 29 are controlled by the event control unit 25 according to the event table stored in the event memories provided in correspondence to each of these units. In this event control unit 25, when at least one of the event memories is used in controlling one of these units, the remaining ones of the event memories are accessible for rewriting, and the high speed and continuous execution of the pulse sequence is realized by sequentially switching the currently used event memory.

Figure 12:
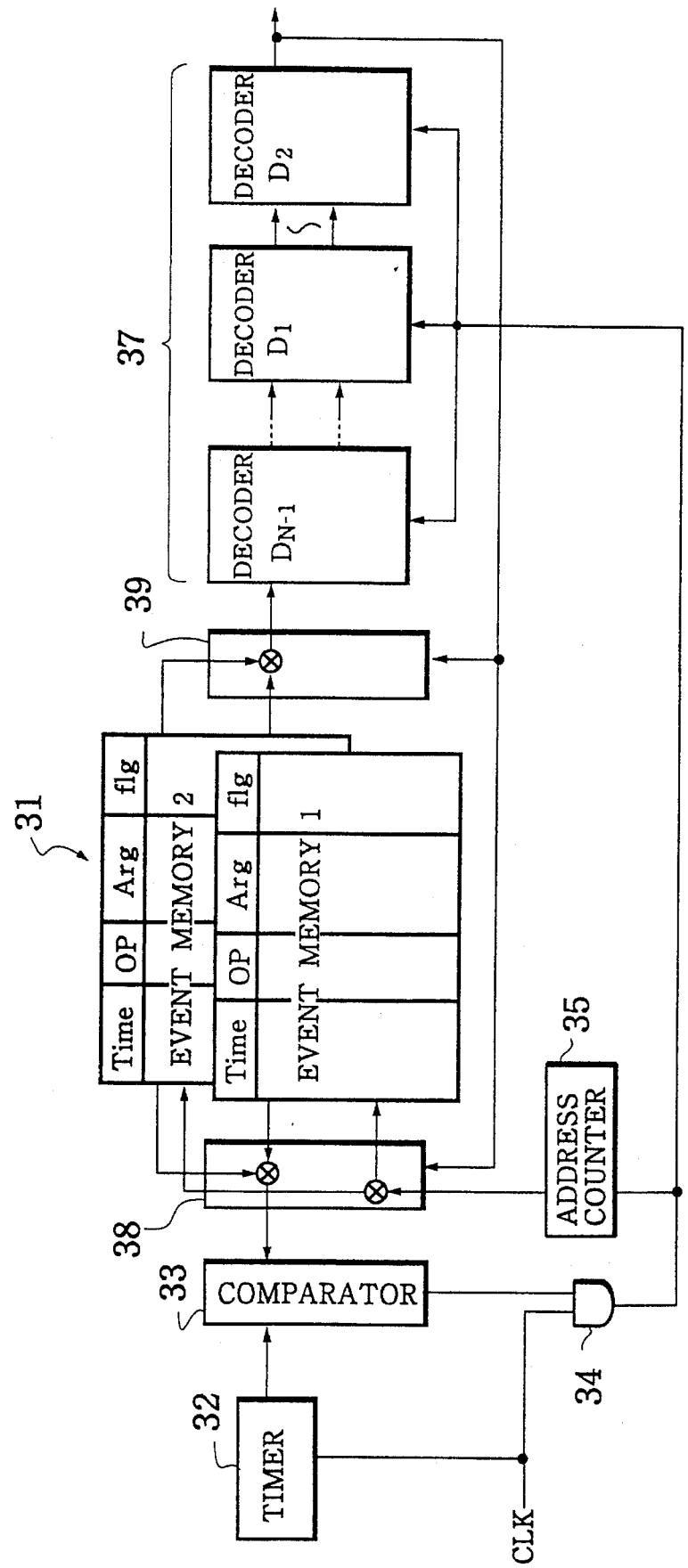
FIG. 12 is a block diagram of an event control unit in the sequence controller of FIG. 9.

This event control unit 25 has a further detail configuration as shown in FIG. 12, which is incorporating a feature to improve the time resolution of the event controlling.

Namely, the event control unit 25 comprises: a plurality of event memories 31, which store the event table; a timer 32 for counting time, which is operated by the clock signal CLK; the comparator 33 for comparing the time counted by the timer 32 with each time registered in each entry in each event memory 31; an AND gate 37 for taking AND of the clock signal CLK and the output of the comparator 33; an address counter for counting the address in the event memory 31; a plurality (N in this embodiment) of decoders ($D_{N-1}$ to $D_0$) 37 connected in series, for decoding the event memory entries read out from the currently used event memory 31 according to the addresses specified by the address counter 35; a first switch 38 for selectively supplying the time registered in each entry in the event memories 31 to the comparator 33, according to the output of the decoders 37; and a second switch 39 for selectively supplying each entry read out from the currently used event memory 31 to the decoders 37, according to the output of the decoders 37.

Here, each entry of each event memory 31 has the slots for Time, Operation code (OP), Argument (Arg), and flags (flg), as will be described in detail below.

In this configuration of FIG. 12, the event decoding operation is divided into a plurality of steps by using the decoders 37 connected in series, and each step of decoding is carried out at each clock CLK, in order to speed up the event decoding speed. Here, at each timing of the output of the AND gate 34, the decoded data are sequentially handed from one of the decoders 37 to the next one of the decoders 37, such that the pre-reading of a plurality of the event codes can be realized in a manner similar to the pre-reading control used in a computer technology. Here, however, there is nothing corresponding to the jump instruction appearing in the computer technology, so that the continuity of the decoding steps is automatically guaranteed. The decoders 37 effectively decodes a plurality of the event codes in parallel, and the event control unit 25 is capable of carrying out a plurality of the mutually consistent events simultaneously.

Thus, it becomes possible in this event control unit 25 to improve the time resolution of the event controlling, because of the pre-reading realized by the decoders 37 and a plurality of the event memories 31 which can be selectively connected to the decoders 37.

Next, the feature incorporated in this event control unit 25 for shortening the time required for the rewriting of the event memories 31 will be described.

First, the operation codes to be utilized in the event memories 31 can be summarized by the table shown in FIGS. 13A and 13B. In the description of the contents of these operation codes shown in FIGS. 13A and 13B, SEP memory is a spin excitation pulse memory for storing the RF pulse forms.

Now, an event table for specifying an entire pulse sequence execution according to the operation codes as shown in FIGS. 13A and 13B can have a plurality of arguments, so that the event table itself has a fully developed data structure as shown in FIG. 14, where the meaning of each slot is as follows.

Time : a time setting (initial value)

Frq-T : a time rewriting frequency, in which
  0: no rewriting
  1: rewriting for every TR
  2: rewriting for every two TRs Add : an increment (or a decrement) for rewriting OP-code: an operation code Arg1 : an argument 1 (initial value)

Erq1 : an argument 1 rewriting frequency

Add/Tgl: an increment for rewriting/+/ −/T, in which
  numeral: increment to be added
  + : changing polarity to positive
  − : changing polarity to negative T:CX: table look-up for CX-th entry Thus, in this data structure of the event table, the frequency and the increment for the rewriting of each of the time, the operation code, and the arguments are specified, so as to facilitate the repeated executions of the same pulse sequences with sequentially changed imaging conditions according to which the event table must be rewritten.

On the other hand, each event memory 31 stores a part of the event table in a form shown in FIG. 15 including the slots for Time, OP-code, and Arg similar to those shown in FIG. 14, along with the flags Time-flg, OP-flg, and Arg-flg, where the meaning of each flag is as follows.

Time-flg: a time rewriting table entry

OP-flg : an operation code rewriting table entry

Arg-flg : an argument rewriting table entry

Furthermore, in this embodiment, in order to realize the rewriting of the event memory for every TR, the rewriting table in a form shown in FIG. 16 is also provided in the event control unit 25, where the meaning of each slot is as follows.

Frg : a rewriting frequency

Mode: a rewriting mode selection, in which
  D: current value 30 increment (direct mode)
  R: bit reversal (0/1 toggle) mode
  T: table look-up mode Now : a current value or address Inc : an increment or a size of one word to rewrite Note that the event memory of FIG. 15 and the rewriting table of FIG. 16 can be derived from the event table of FIG. 14.

Using these event memory of FIG. 15 and rewriting table of FIG. 16, the rewriting of the event memory can be realized in this embodiment as follows.

Namely, in the event memory of FIG. 15, as the flags are provided, the appropriate rewriting table entry specifying a manner of rewriting each one of the time slot, operation code slot, and the argument slot can be indicated by the flags, so that the appropriate rewriting can be carried out in accordance with the indicated rewriting table entry, only for the slot that needs to be rewritten. Thus, there is no need to make any wasteful rewriting of the other slots which are not to be changed, by rewriting the same contents as these slots currently have into these slots. Consequently, the event memory rewriting operation can be made faster in this embodiment.

In addition, when the current value is used for the slot "Now", there is no need to make any change in the rewriting table of FIG. 16 even when the time order rearrangement is carried out in order to prevent the reversing of the time order.

Note here that, in case of using the specific address of the event memory for the slot "Now" in the rewriting table, the correspondence between the event memory and the rewriting table cannot be maintained when the rearrangement by hardware is made in the event memory. Even when the rearrangement by software is employed, the rewriting table must be rewritten every time there is a rearrangement, so that the overhead is large.

Also, in a case of not using the rearrangement at all, the fields for the flags may not necessarily be provided in the event memory integrally, and the similar effect can also be obtained by providing the similar flags on the host computer 12 side.

Figure 17:
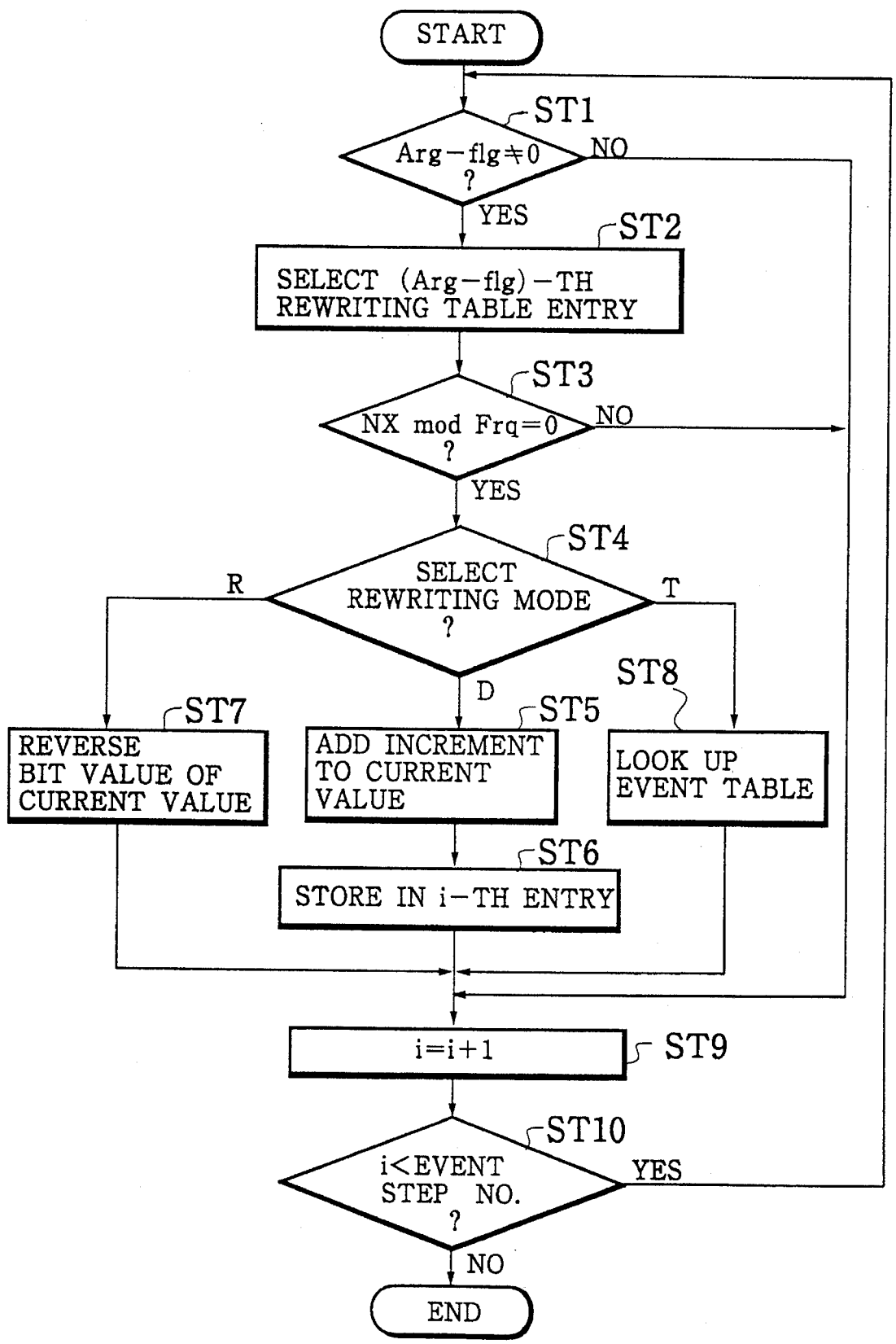
FIG. 17 is a flow chart for the procedure of rewriting the event memory in the event control unit of FIG. 12.

More specifically, the rewriting operation using these event memory and the rewriting table can be carried out for a case of rewriting the argument portion, for example, according to the flow chart of FIG. 17 as follows.

At the step ST1, whether the flag Arg-flg indicating the rewriting of the argument portion is zero or not is checked in the event memory.

When it is zero, the process proceeds to the step ST9 described below, whereas otherwise, next at the step ST2, the (Arg-flg)-th rewriting table entry specified by the Arg-flg is selected.

Then, at the step ST3, whether the current number of repetitions NX divided by the Frq (i.e., NX mod Frq) registered in the selected rewriting table entry is zero or not is determined.

When it is not zero, the process proceeds to the step ST9 described below, whereas otherwise next at the step ST4, the rewriting mode is selected according to the Mode registered in the selected rewriting table entry. In a case of the direct mode D, the increment specified by the event memory is added to the current value at the step ST5, and registered as an i-th entry at the step ST6. In a case of the reversal mode R, next at the step ST7, the bit value of the current value is reversed. In a case of the table look-up mode, next at the step ST8, the event table is looked up.

Then, at the step S11, the counter number i is increased by one, and next at the step ST 10, whether the increased counter number i is not greater than the event step numbers. When it is so, the process returns to the step ST1 above, whereas otherwise the process is terminated.

It is to be noted that the rewriting of the Time slot as well as the OP-code slot can be carried out in the similar manner. Also, by putting the rewriting frequency in a matrix form, a double repetition required in the 3D imaging can be handled In a case the length of the pulse sequence changes in every TR, for such a reason as a presence or an absence of the pre-pulse portion, the unnecessary top portions can be skipped at each TR by starting the event execution function from the appropriate address. In order to skip the unnecessary last portion, the operation of the event control unit can be stopped and the control can be returned back to the host computer 12 side, or else the OP-code is rewritten to NOP.

Also, by the repeated use of the starting address setting and the STOP command, many short pulse sequences can be carried out, with a plurality of the starting addresses specified in the event memory, so that the event memory can be divided over a plurality of banks, and the re-loading of the event memory can be eliminated.

In summary, the pulse sequence execution according to this embodiment proceeds in the following steps for a case of the pin echo (SE) and for a case of the high speed imaging method.

<A case of SE>

(a) Transmission of the parameter block from the host computer 12 to the sequence controller 9.

(b) Generation of the event memory, the rewriting table, the gradient magnetic field memory, and the SEP memory according to the parameter block, and transmission of these from the host computer 12 to the sequence controller 9.

(c) Initialization of the RF control unit 26, the data acquisition and processing control unit 27, and the gradient magnetic field control unit 28, according to the parameter block.

(d) Execution of the event memory.

(e) TR interval operations, including: rewriting of the event memory, transmission of the acquired data to the host computer 12, and event memory execution re-start operation.

These steps (a) to (e) are sequentially carried out according to the predetermined schedule, and a plurality of images can be obtained by repeating the steps (d) and (e). The TR interval itself can be managed by the real time timer of the host computer 12.

<A case of high speed imaging method>

In this case, the steps (a) to (e) similar to those described above for the case of SE are carried out. In addition, the execution of the event memory and the rewriting of the event memory can be carried out in parallel in such a manner that while one event memory is executed, the other event memories are rewritten. The TR interval itself can be managed by a waiting time up to the channel switching instruction provided at the end of each event memory.

It is to be noted here that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for pulse sequence control in a nuclear magnetic resonance imaging, comprising the steps of:

measuring characteristic parameters affecting a pulse sequence;

simulating an execution of the pulse sequence by using simulated RF pulses, simulated gradient magnetic fields, simulated static magnetic field, and simulated nuclear spin density distribution, according to the characteristic parameters measured at the measuring step, to obtain a result of a simulation as a spin motion and an echo signal resulting from the simulated RF pulses, the simulated gradient magnetic fields, the simulated static magnetic field, and the simulated nuclear spin density distribution; and automatically adjusting the pulse sequence to an optimum setting according to the result of the simulation obtained at the simulating step.

2. The method of claim 1, wherein at the measuring step, the characteristic parameters includes system characteristic parameters related to an apparatus for the nuclear magnetic resonance imaging, and target characteristic parameters related to a target object of the nuclear magnetic resonance imaging.

3. The method of claim 1, further comprising the steps of:

storing event codes indicating events for realizing the execution of the pulse sequence;

decoding a plurality of the event codes stored at the storing step by a plurality of decoder means in parallel; and controlling an apparatus for the nuclear magnetic resonance imaging by a sequence controller to carry out the events indicated the event codes decoded by said plurality of decoder means.

4. The method of claim 3, wherein at the decoding step, said plurality of decoder means pre-read a plurality of the event codes stored in the event memory.

5. The method of claim 3, wherein at the storing step, the event codes are stored in a plurality of event memories.

6. The method of claim 1, further comprising the steps of:

storing event codes indicating events for realizing the execution of the pulse sequence in an event memory, each entry of the event memory having a time slot, an event code slot, and an argument slot;

providing a rewriting table storing rewriting table entries specifying a manner of rewriting each one of the time slot, the event code slot, and the argument slot of each entry in the event memory;

indicating an appropriate one of the rewriting table entries in the rewriting table for each one of the time slot, the event code slot, and the argument slot, in conjunction with the event memory; and rewriting any one of the time slot, the event code slot, and the argument slot of each entry in the event memory according to the corresponding rewriting table entry indicated at the indicating step.

7. The method of claim 6, wherein at the specifying step, the appropriate one of the rewriting table entries in the rewriting table for each one of the time slot, the event code slot, and the argument slot, is indicated in a form of a flag provided in the event memory in correspondence to said each one of the time slot, the event code slot, and the argument slot.

8. An apparatus for pulse sequence control in a nuclear magnetic resonance imaging, comprising:

measurement means for measuring characteristic parameters affecting a pulse sequence;

simulator means for simulating an execution of the pulse sequence by using simulated RF pulses, simulated gradient magnetic fields, simulated static magnetic field, and simulated nuclear spin density distribution, according to the characteristic parameters measured by the measurement means, to obtain a result of a simulation as a spin motion and an echo signal resulting from the simulated RF pulses, the simulated gradient magnetic fields, the simulated static magnetic field, and the simulated nuclear spin density distribution; and pulse sequence adjustment means for automatically adjusting the pulse sequence to an optimum setting according to the result of the simulation obtained by the simulator means.

9. The apparatus of claim 8, wherein the measurement means measures the characteristic parameters including system characteristic parameters related to an apparatus for the nuclear magnetic resonance imaging, and target characteristic parameters related to a target object of the nuclear magnetic resonance imaging.

10. The apparatus of claim 8, further comprising:

event memory means for storing event codes indicating events for realizing the execution of the pulse sequence;

a plurality of decoder means for decoding a plurality of the event codes stored in the event memory means in parallel; and sequence controller means for controlling an apparatus for the nuclear magnetic resonance imaging by a sequence controller to carry out the events indicated the event codes decoded by said plurality of decoder means.

11. The apparatus of claim 10, wherein said plurality of decoder means pre-read a plurality of the event codes stored in the event memory means.

12. The apparatus of claim 10, wherein the event memory means contains a plurality of event memories, such that the event codes for the pulse sequence as a whole is divided into a plurality of parts and each part is stored in one of said plurality of event memories.

13. The apparatus of claim 8, further comprising:

event memory means for storing event codes indicating events for realizing the execution of the pulse sequence, each entry of the event memory means having a time slot, an event code slot, and an argument slot;

rewriting table means for storing rewriting table entries specifying a manner of rewriting each one of the time slot, the event code slot, and the argument slot of each entry in the event memory means;

indicator means for indicating an appropriate one of the rewriting table entries in the rewriting table for each one of the time slot, the event code slot, and the argument slot, in conjunction with the event memory; and means for rewriting any one of the time slot, the event code slot, and the argument slot of each entry in the event memory means according to the corresponding rewriting table entry indicated by the indicator means.

14. The apparatus of claim 13, wherein the indicator means for indicating the appropriate one of the rewriting table entries in the rewriting table for each one of the time slot, the event code slot, and the argument slot, is formed in a form of a flag provided in the event memory means in correspondence to said each one of the time slot, the event code slot, and the argument slot.

* * * * *